United States Patent
Cai

(10) Patent No.: US 10,960,555 B2
(45) Date of Patent: Mar. 30, 2021

(54) ROBOT ARM

(71) Applicant: Wuhan China Star Optoelectronics Technology Co., Ltd., Wuhan (CN)

(72) Inventor: Guangyu Cai, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 57 days.

(21) Appl. No.: 16/463,375

(22) PCT Filed: Nov. 26, 2018

(86) PCT No.: PCT/CN2018/117537
§ 371 (c)(1),
(2) Date: May 23, 2019

(87) PCT Pub. No.: WO2020/087606
PCT Pub. Date: May 7, 2020

(65) Prior Publication Data
US 2020/0180165 A1 Jun. 11, 2020

(51) Int. Cl.
*B25J 15/06* (2006.01)
*B25J 15/00* (2006.01)

(52) U.S. Cl.
CPC ....... *B25J 15/0014* (2013.01); *B25J 15/0683* (2013.01)

(58) Field of Classification Search
CPC .................... B25J 15/0014; B25J 15/0033; B25J 15/0683; H01L 21/6838
See application file for complete search history.

(56) References Cited

U.S. PATENT DOCUMENTS

| | | | | |
|---|---|---|---|---|
| 6,183,026 B1* | 2/2001 | Cai | ...................... | H01L 21/6838 294/183 |
| 6,196,532 B1* | 3/2001 | Otwell | .................. | B25B 11/005 269/21 |
| 8,393,662 B2* | 3/2013 | Fujii | ................. | H01L 21/68707 294/213 |
| 8,465,072 B2* | 6/2013 | Wu | ...................... | B65G 49/067 294/213 |
| 9,776,333 B2* | 10/2017 | Sakai | .................. | B25J 15/0014 |
| 9,941,147 B2* | 4/2018 | Wang | .................. | H01L 21/6838 |
| 2005/0110292 A1* | 5/2005 | Baumann | ............... | B25J 9/0012 294/188 |
| 2014/0265394 A1* | 9/2014 | Pergande | ............... | B25J 9/0012 294/81.5 |
| 2017/0040205 A1* | 2/2017 | Hiester | ............. | H01L 21/67742 |

* cited by examiner

*Primary Examiner* — Dean J Kramer

(57) ABSTRACT

The present invention provides a robot arm. The robot arm is for forking a substrate, and includes: a substrate fork and vacuum cups. The substrate fork includes parallel spaced prongs, and an upper surface of each prong is provided with vacuum cups spaced along an extending direction of the prong; and vacuum cups on two prongs at outermost sides of the substrate fork are scratch-resistant vacuum cups, and a top face and a side face of each scratch-resistant vacuum cup are connected through an arc-shaped surface. By setting the top face of the scratch-resistant vacuum cup connected to the side face through the arc-shaped surface, when the substrate is bent with the gravity, the contact area between the substrate and the scratch-resistant vacuum cup can be increased, to improve the friction therebetween, prevent the substrate from being scratched in a transportation process, and ensure the security of substrate transportation.

9 Claims, 5 Drawing Sheets

ROBOT ARM

RELATED APPLICATIONS

This application is a National Phase of PCT Patent Application No. PCT/CN2018/117537 having International filing date of Nov. 26, 2018, which claims the benefit of priority of Chinese Patent Application No. 201811271897.6 filed on Oct. 29, 2018. The contents of the above applications are all incorporated by reference as if fully set forth herein in their entirety.

FIELD AND BACKGROUND OF THE INVENTION

The present invention relates to the field of display technologies, and in particular, to a robot arm.

With the development of display technologies, flat panel display devices such as liquid crystal displays (LCDs) and organic light emitting diode (OLED) displays are widely applied to various consumer electronic products such as mobile phones, televisions, personal digital assistants, digital cameras, notebook computers, and desktop computers due to the advantages such as high definition, power saving, a thin body, and a wide application range, and have become the mainstream in the display devices.

Most LCDs in the current market are backlight LCDs, which include an LCD panel and a backlight module. The working principle of the LCD panel is injecting liquid crystal molecules between a thin film transistor (TFT) array substrate and a color filter (CF) substrate, and applying drive voltages to the two substrates to control the rotation directions of the liquid crystal molecules, to refract light of the backlight module to generate images.

A glass substrate is an important component of the LCD, is a basic raw material of a liquid crystal panel, and greatly affects product performance. The key technical indicators such as the resolution, the transmittance, the weight, and the view angle of the display are directly closely related to the performance of the glass substrate. Currently, in a production process of the LCD, a robot arm is used to fork the glass substrate. As shown in FIG. 1, a current robot arm includes: a substrate fork 10 and vacuum cups 20. The substrate fork 10 includes a plurality of prongs that are spaced and parallel 101, and an upper surface of each prong 101 is provided with a plurality of vacuum cups 20 spaced along an extending direction of the prong 101. During forking, the substrate 102 is located on an upper surface of the substrate fork 10 and drawn by the vacuum cups 20 on each prong 101. When forking the substrate 102, the substrate fork 10 supports a middle region located in the substrate 102, and an edge region of the substrate 102 is not effectively supported, and may be bent to a curved state due to the gravity, causing the substrate 102 to be in contact with the sharp edges of the vacuum cups 20. In a motion process of the robot arm, the friction between the substrate 102 and the vacuum cups 20 may scratch the substrate 102, affecting subsequent processes.

SUMMARY OF THE INVENTION

The objective of the present invention is to provide a robot arm that can prevent a substrate from being scratched by vacuum cups, and ensure the security of substrate transportation.

To achieve the foregoing objective, the present invention provides a robot arm. The robot arm is configured for forking a substrate, and includes a substrate fork.

The substrate fork includes a plurality of prongs that are spaced and parallel, and an upper surface of each prong is provided with a plurality of vacuum cups spaced along an extending direction of the prong.

The vacuum cups on two of the prongs at outermost sides of the substrate fork are scratch-resistant vacuum cups, and a top face and a side face of each scratch-resistant vacuum cup are connected through an arc-shaped surface.

During forking, the substrate is located on an upper surface of the substrate fork and drawn by the vacuum cups on each prong, and a radian of the arc-shaped surface matches a radian of an edge of the substrate bent with the gravity.

A radian of the arc-shaped surface is 0.1 to 0.12 rads.

The radian of the arc-shaped surface is 0.117 rads.

The substrate fork further includes a connecting arm connected to the prongs, and the prongs are arranged along an extending direction of the connecting arm.

The robot arm further includes a drive mechanism connected to the substrate fork, wherein the drive mechanism is configured for driving the substrate fork to move along a preset picking path.

The substrate fork includes four prongs that are spaced and parallel, and each prong is provided with four vacuum cups.

A top face of each scratch-resistant vacuum cup includes a first portion and a second portion sequentially arranged from an outer side of the substrate fork to an inner side, the first portion is connected to the side face through the arc-shaped surface, and the second portion is directly connected to the side face.

The vacuum cups are cylindrical.

The material of the vacuum cup is polyimide or polyether ether ketone (PEEK), the material of the prong is carbon fiber, and the substrate is a glass substrate.

Beneficial effects of the present invention are as follows: The present invention provides a robot arm, wherein the robot arm is configured for forking a substrate, and includes: a substrate fork and vacuum cups. The substrate fork includes a plurality of prongs that are spaced and parallel, and an upper surface of each prong is provided with a plurality of vacuum cups spaced along an extending direction of the prong; and the vacuum cups on two of the prongs at outermost sides of the substrate fork are scratch-resistant vacuum cups, and a top face and a side face of each scratch-resistant vacuum cup are connected through an arc-shaped surface. The top face of the scratch-resistant vacuum cup is set to be connected to the side face through the arc-shaped surface, such that when the substrate is bent with the gravity, the contact area between the substrate and the scratch-resistant vacuum cup can be increased, to improve the friction therebetween, prevent the substrate from being scratched in a transportation process, and ensure the security of substrate transportation.

BRIEF DESCRIPTION OF THE SEVERAL VIEWS OF THE DRAWINGS

To further understand the features and technical content of the present invention, refer to the following detailed descriptions and accompanying drawings related to the present invention. However, the accompanying drawings are only configured for providing reference and description, but not configured for limiting the present invention.

In the accompanying drawings.

DESCRIPTION OF SPECIFIC EMBODIMENTS OF THE INVENTION

To further illustrate the technical means used in the present invention and the effects thereof, detailed descriptions are provided below with reference to the preferred embodiments and accompanying drawings of the present invention.

Figure 1:
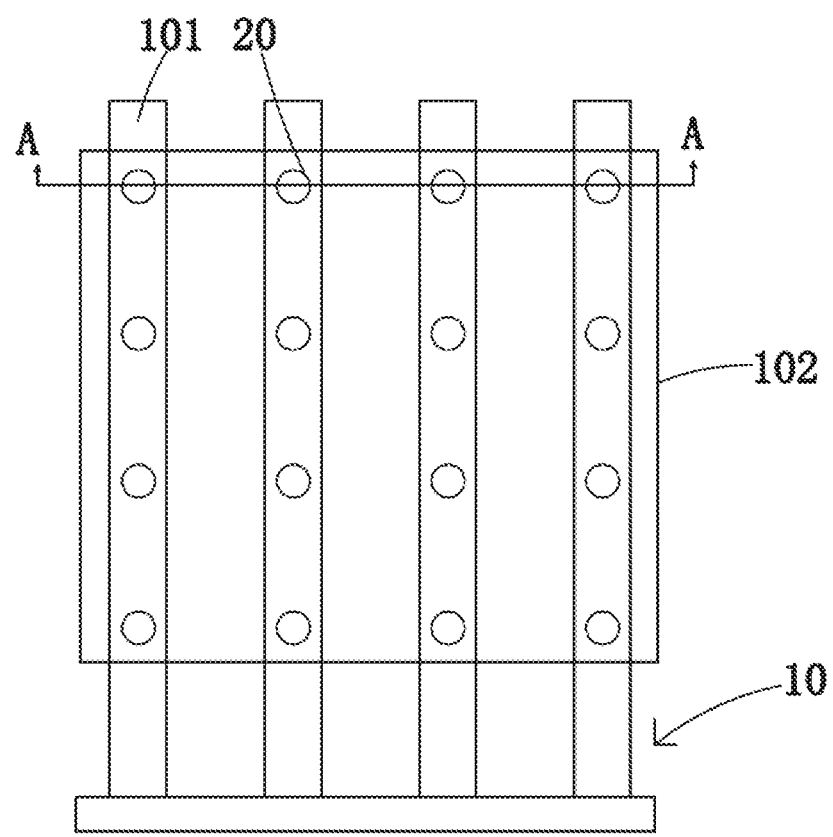
FIG. 1 is a schematic diagram of a structure of a conventional robot arm.
Figure 2:
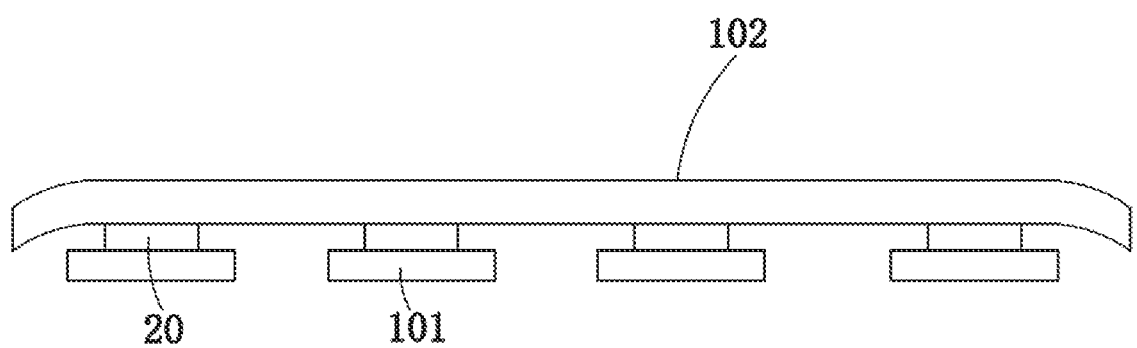
FIG. 2 is a sectional view corresponding to line A-A in FIG. 1.
Figure 3:
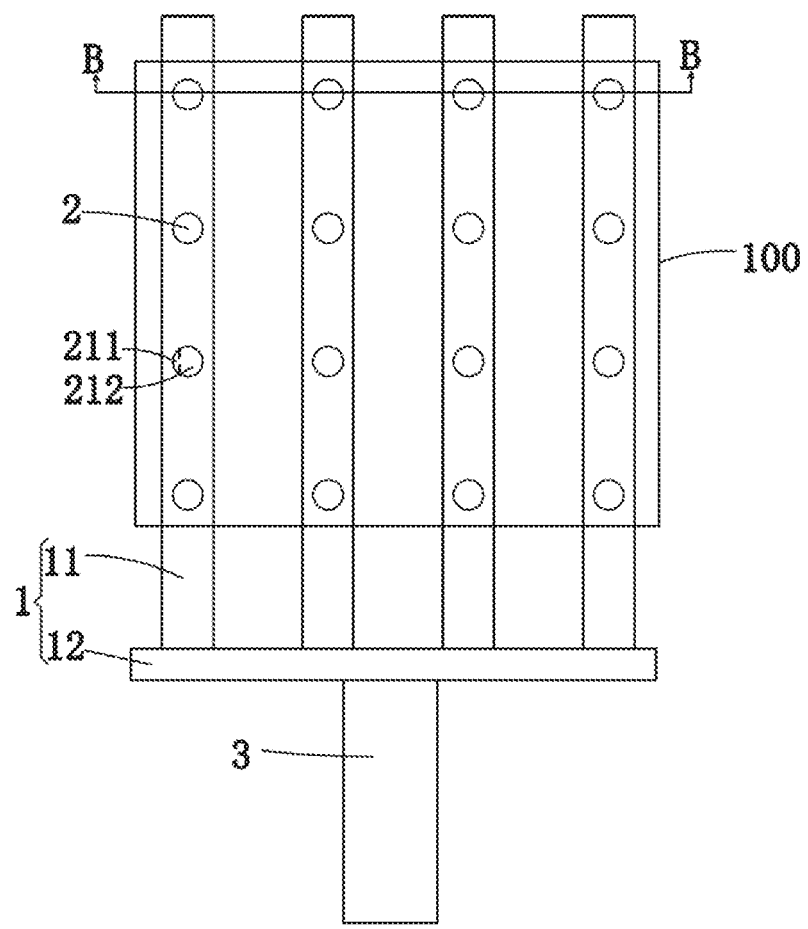
FIG. 3 is a schematic diagram of a structure of a robot arm according to the present invention.
Figure 4:
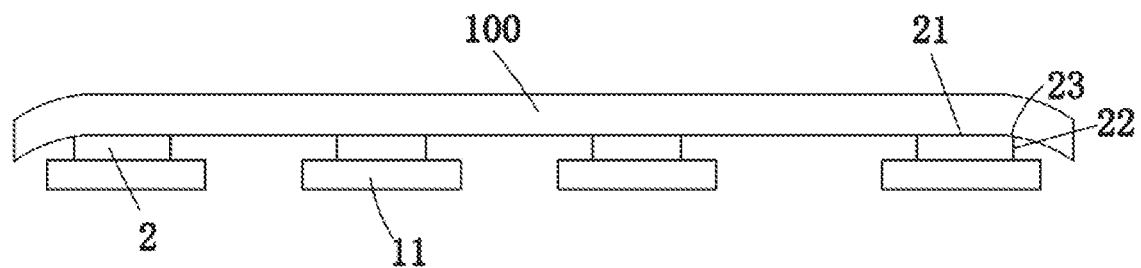
FIG. 4 is a sectional view corresponding to B-B in FIG. 3.
Figure 5:
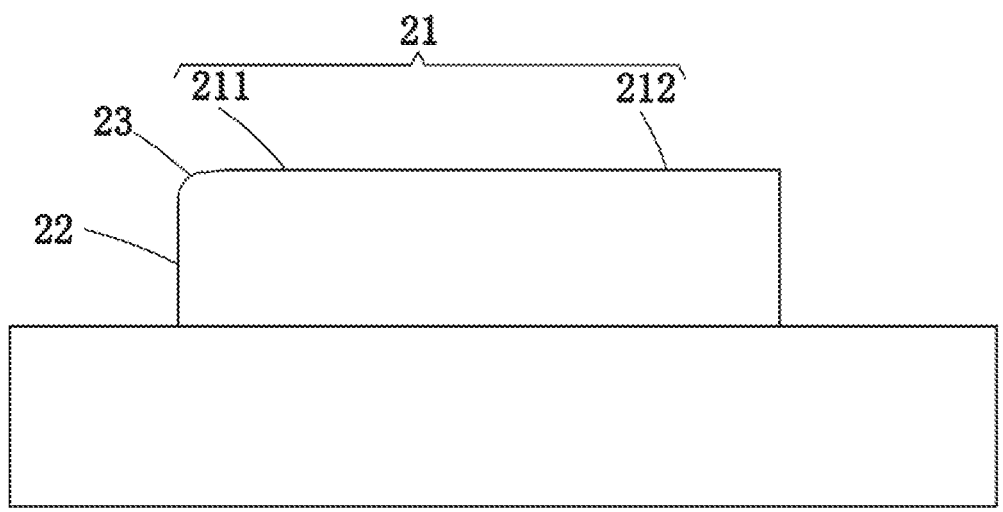
FIG. 5 is a schematic enlarged view of a scratch-resistant vacuum cup of a robot arm according to the present invention.

Referring to FIG. 3 to FIG. 5, the present invention provides a robot arm. The robot arm is configured for forking a substrate 100, and includes: a substrate fork 1 and vacuum cups 2.

The substrate fork 1 includes a plurality of prongs that are spaced and parallel 11, and an upper surface of each prong 11 is provided with a plurality of vacuum cups 2 spaced along an extending direction of the prong 11.

The vacuum cups 2 on two of the prongs 11 at outermost sides of the substrate fork 1 are scratch-resistant vacuum cups, and a top face 21 and a side face 22 of each scratch-resistant vacuum cup are connected through an arc-shaped surface 23.

In details, during forking, the substrate 100 is located on an upper surface of the substrate fork 1 and drawn by the vacuum cups 2 on each prong 11, and a radian of the arc-shaped surface 23 matches a radian of an edge of the substrate 100 bent with the gravity.

In details, the radian of the arc-shaped surface 23 is 0.1 to 0.12 rads.

Preferably, the radian of the arc-shaped surface 23 is 0.117 rads.

Further, as shown in FIG. 3, the robot arm further includes a drive mechanism 3 connected to the substrate fork 1. The drive mechanism 3 is configured for driving the substrate fork 1 to move along a preset picking path.

Further, the substrate fork 1 further includes a connecting arm 12 connected to the prongs 11, and the prongs 11 are arranged along an extending direction of the connecting arm 12.

Based on design requirements, the vacuum cup 2 may be a high-temperature vacuum cup, and the material may be selected as polyimide, and preferably, the Vespel material. In addition, the vacuum cup 2 may be a non-high-temperature vacuum cup, and the corresponding material may be selected as polyether ether ketone.

Preferably, the material of the prong 11 is carbon fiber, and the substrate 100 is a glass substrate.

In details, in a preferred embodiment of the present invention, the substrate fork 1 includes four prongs that are spaced and parallel 11, each prong 11 is provided with four vacuum cups 2, and the vacuum cups 2 are cylindrical. The vacuum cups 2 on two of the prongs 11 at outermost sides of the substrate fork 1 are scratch-resistant vacuum cups, a top face 21 of each scratch-resistant vacuum cup includes a first portion 211 and a second portion 212 sequentially arranged from an outer side of the substrate fork 1 to an inner side, the first portion 211 is connected to the side face 22 through the arc-shaped surface 23, and the second portion 212 is directly connected to the side face 22.

When the robot arm works, the drive mechanism 3 drives the substrate fork 1 to move along the preset picking path and fork the substrate 100. After being forked, the substrate 100 is located on the upper surface of the substrate fork 1, and is drawn by the vacuum cups 2. The edge of the substrate 100 is beyond the edge of the substrate fork 1, and therefore, the edge of the substrate 100 is naturally bent with the gravity by particular radian. The radian matches the radian of the arc-shaped surface 23, such that the bent position of the substrate 100 and the arc-shaped surface 23 fit together. Compared with the prior art, the contact area between the bent substrate 100 and the vacuum cup 2 is increased, and the friction is also increased, to prevent the substrate from being scratched in a transportation process, and ensure the security of substrate transportation.

In conclusion, the present invention provides a robot arm, wherein the robot arm is configured for forking a substrate, and includes: a substrate fork and vacuum cups. The substrate fork includes a plurality of prongs that are spaced and parallel, and an upper surface of each prong is provided with a plurality of vacuum cups spaced along an extending direction of the prong; and the vacuum cups on two of the prongs at outermost sides of the substrate fork are scratch-resistant vacuum cups, and a top face and a side face of each scratch-resistant vacuum cup are connected through an arc-shaped surface. The top face of the scratch-resistant vacuum cup is set to be connected to the side face through the arc-shaped surface, such that when the substrate is bent with the gravity, the contact area between the substrate and the scratch-resistant vacuum cup can be increased, to improve the friction therebetween, prevent the substrate from being scratched in a transportation process, and ensure the security of substrate transportation.

A person of ordinary skill in the art can make various corresponding alternations and variations to the foregoing descriptions according to the technical solution and the technical idea of the present invention, and all the alternations and variations shall fall within the protection scope of the claims of the present invention.

What is claimed is:

1. A robot arm, configured for forking a substrate, and comprising a substrate fork, wherein the substrate fork comprises a plurality of prongs that are spaced and parallel, and an upper surface of each prong is provided with a plurality of vacuum cups spaced along an extending direction of the prong; and the vacuum cups on two of the prongs at outermost sides of the substrate fork are scratch-resistant vacuum cups, each scratch-resistant vacuum cup comprises a top face being substantially circular and a side face being annular and connected to the top face, the top face and the side face of each scratch-resistant vacuum cup are connected through an arc-shaped surface formed partially around an annular outer edge of the top face;

wherein the top face of each scratch-resistant vacuum cup comprises a first portion and a second portion sequentially arranged from an outer side of the substrate fork to an inner side;

wherein the first portion is a minor partial-circular segment and comprises a first arc outer edge, the second portion is a major partial-circular segment and comprises a second arc outer edge, and the first arc outer edge and the second arc outer edge collaboratively forms the annular outer edge of the top face;

wherein the first arc outer edge of the first portion is connected to the side face through the arc-shaped surface, and the second arc outer edge of the second portion is directly connected to the side face.

2. The robot arm as claimed in claim 1, wherein during forking, the substrate is located on an upper surface of the substrate fork and drawn by the vacuum cups on each prong, and a radian of the arc-shaped surface matches a radian of an edge of the substrate bent with the gravity.

3. The robot arm as claimed in claim 1, wherein a radian of the arc-shaped surface is 0.1 to 0.12 rads.

4. The robot arm as claimed in claim 3, wherein the radian of the arc-shaped surface is 0.117 rads.

5. The robot arm as claimed in claim 1, wherein the substrate fork further comprises a connecting arm connected to the prongs, and the prongs are arranged along an extending direction of the connecting arm.

6. The robot arm as claimed in claim 1, further comprising a drive mechanism connected to the substrate fork, wherein the drive mechanism is configured for driving the substrate fork to move along a preset picking path.

7. The robot arm as claimed in claim 1, wherein the substrate fork comprises four prongs that are spaced and parallel, and each prong is provided with four vacuum cups.

8. The robot arm as claimed in claim 1, wherein the vacuum cups are cylindrical.

9. The robot arm as claimed in claim 1, wherein the material of the vacuum cup is polyimide or polyether ether ketone (PEEK), the material of the prong is carbon fiber, and the substrate is a glass substrate.

* * * * *

UNITED STATES PATENT AND TRADEMARK OFFICE
CERTIFICATE OF CORRECTION

Page 1 of 1

PATENT NO. : 10,960,555 B2
APPLICATION NO. : 16/463375
DATED : March 30, 2021
INVENTOR(S) : Guangyu Cai It is certified that error appears in the above-identified patent and that said Letters Patent is hereby corrected as shown below:

On the Title Page

Insert the following:
-- (30) Foreign Application Priority Data
Oct. 29, 2018 (CN) ................ 201811271897.6 --

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*